(12) United States Patent
Michal

(10) Patent No.: US 9,459,311 B2
(45) Date of Patent: Oct. 4, 2016

(54) METHOD OF VALLEY INDUCTANCE CURRENT POLARITY DETECTION IN A PULSE WIDTH MODULATED CIRCUIT WITH AN INDUCTIVE CHARGE

(71) Applicant: STMicroelectronics International N.V., Amsterdam (NL)

(72) Inventor: Vratislav Michal, Grenoble (FR)

(73) Assignee: STMicroelectronics International N.V., Amsterdam (NL)

( * ) Notice: Subject to any disclaimer, the term of this patent is extended or adjusted under 35 U.S.C. 154(b) by 316 days.

(21) Appl. No.: 14/306,489

(22) Filed: Jun. 17, 2014

(65) Prior Publication Data

US 2014/0375332 A1    Dec. 25, 2014

(30) Foreign Application Priority Data

Jun. 25, 2013  (EP) .................................. 13305875

(51) Int. Cl.

| | | |
|---|---|---|
| G01R 31/28 | (2006.01) | |
| H02M 3/156 | (2006.01) | |
| H02M 3/158 | (2006.01) | |
| G01R 19/00 | (2006.01) | |
| G01R 19/14 | (2006.01) | |
| G01R 19/165 | (2006.01) | |
| H02M 1/00 | (2006.01) | |
| G01R 31/40 | (2014.01) | |

(52) U.S. Cl.
CPC ........... G01R 31/28 (2013.01); G01R 19/0092 (2013.01); G01R 19/14 (2013.01); G01R 19/16538 (2013.01); H02M 3/156 (2013.01); H02M 3/158 (2013.01); *G01R 31/40* (2013.01); *H02M 2001/0009* (2013.01)

(58) Field of Classification Search
CPC    G01R 19/16538; G01R 31/40; G01R 19/14; G01R 19/0092; H02M 2001/0009; H02M 3/158
USPC ........................................................ 324/537
See application file for complete search history.

(56) References Cited

U.S. PATENT DOCUMENTS

| | | | | |
|---|---|---|---|---|
| 6,696,861 B1 * | 2/2004 | Baldwin | ............... | H02M 3/156 326/27 |
| 7,936,160 B1 * | 5/2011 | Sheehan | ............... | H02M 3/156 323/222 |
| 2008/0211471 A1 * | 9/2008 | Liao | ....................... | H02M 3/156 323/282 |

FOREIGN PATENT DOCUMENTS

EP    0884746 A2    12/1998

OTHER PUBLICATIONS

EPO Search Report and Written Opinion for EP 13305875.0 mailed Nov. 27, 2013 (7 pages).

(Continued)

*Primary Examiner* — Jermele M Hollington
*Assistant Examiner* — Robert P Alejnikov, Jr.
(74) *Attorney, Agent, or Firm* — Gardere Wynne Sewell LLP

(57) ABSTRACT

A valley inductance current polarity change in a pulse width modulated circuit charged with an inductive charge is detected by comparing respective times that a first output of the circuit charged with an inductive charge and a second output of a pulse width modulated reference circuit with no inductive charge reach an output level. Responsive thereto, control over operation of the pulse width modulated circuit charged with an inductive charge is made with respect to switching to a pulse skipping mode of operation or keeping the pulse width modulation mode of operation.

29 Claims, 6 Drawing Sheets

(56) References Cited

OTHER PUBLICATIONS

Yuan Gao et al: "A Novel Zero-Current-Detector for DCM Operation in Synchronous Converter," Industrial Electronics (ISIE), 2012 IEEE International Symposium on, IEEE, May 28, 2012, pp. 99-104.

Forghani-Zadeh H P et al: "Current-Sensing Techniques for DC-DC Converters," The 2002 45th Midwest Symposium on Circuits and Systems, Conference Proceedings, Tulsa, OK, Aug. 4-7, 2002, pp. 577-580.

* cited by examiner

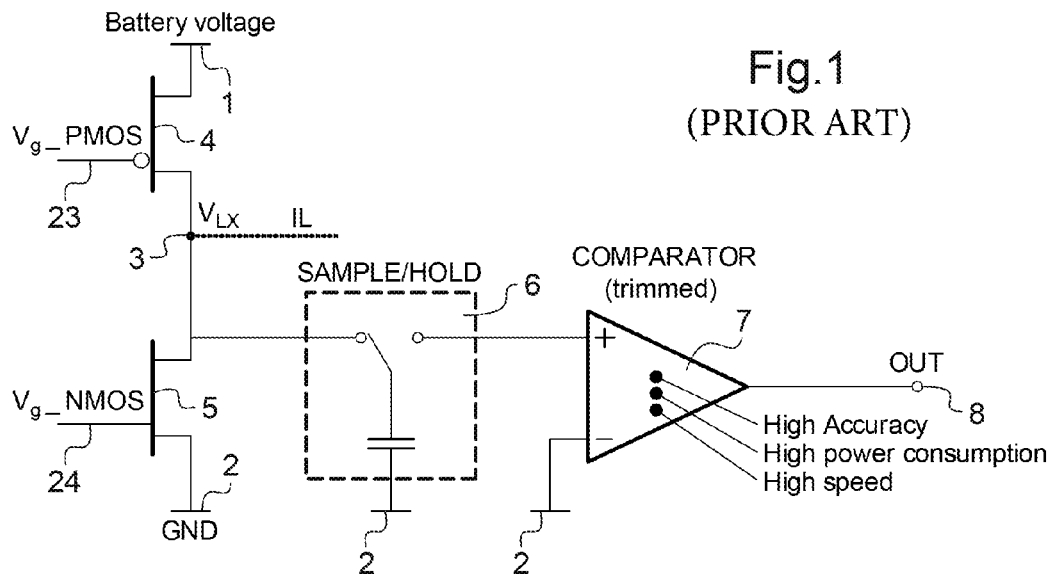
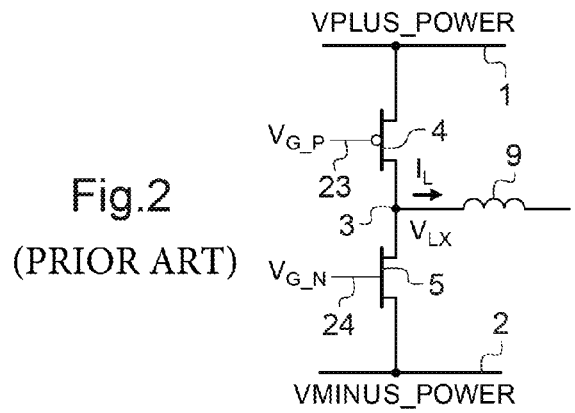
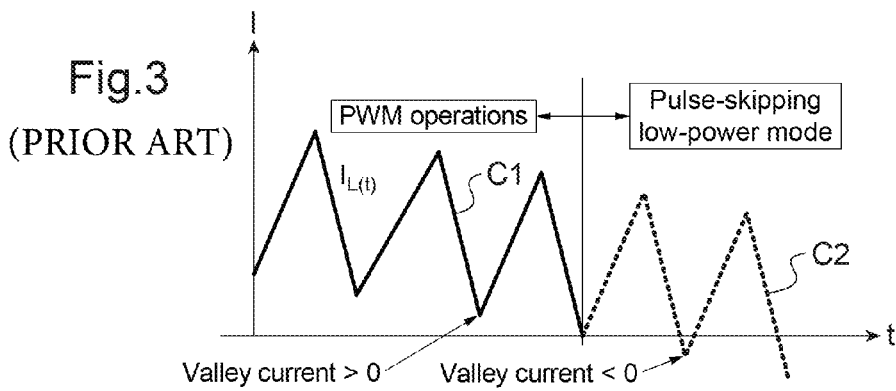

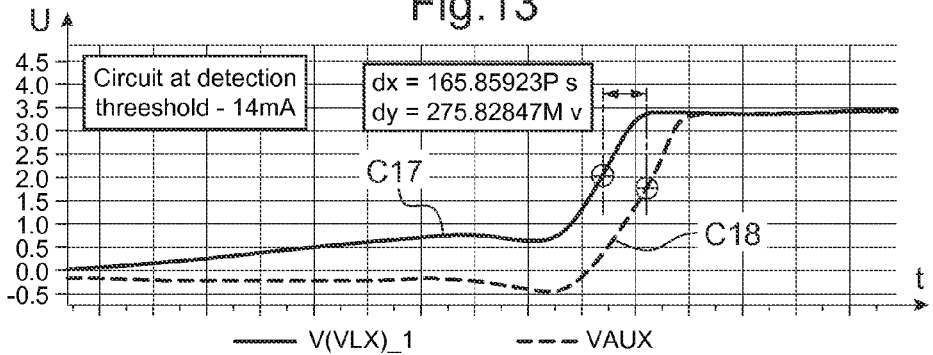
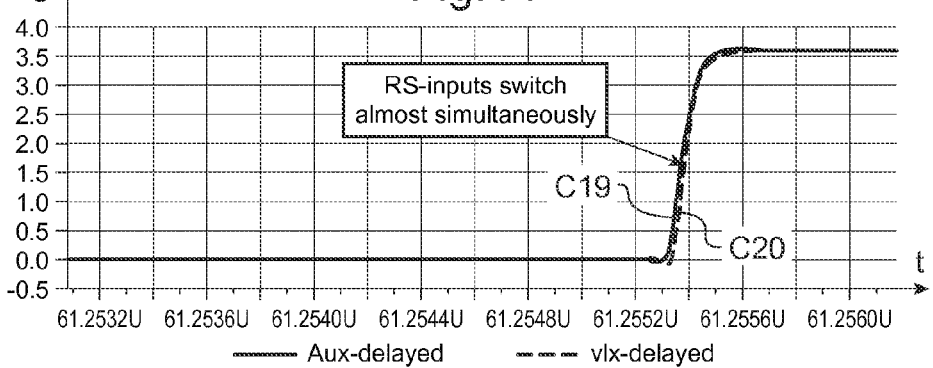
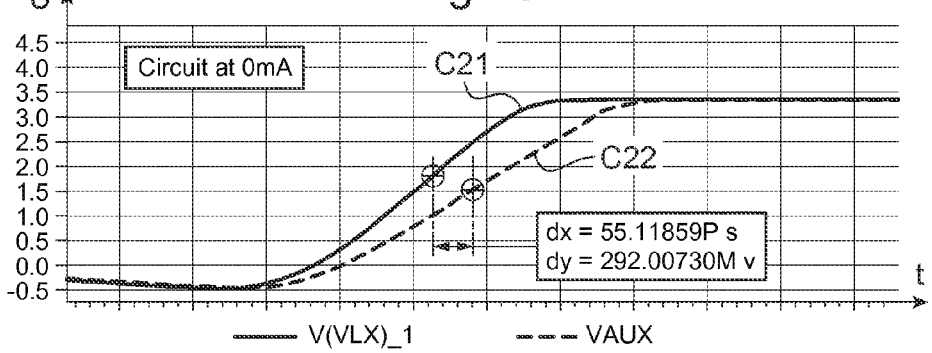
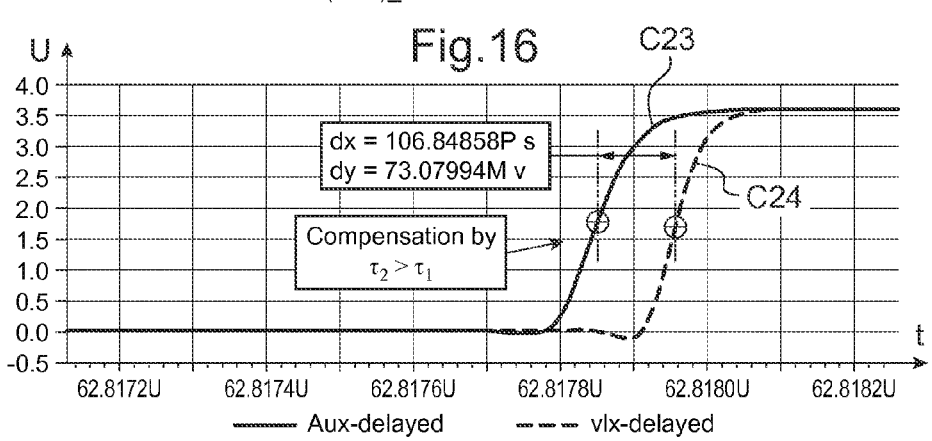

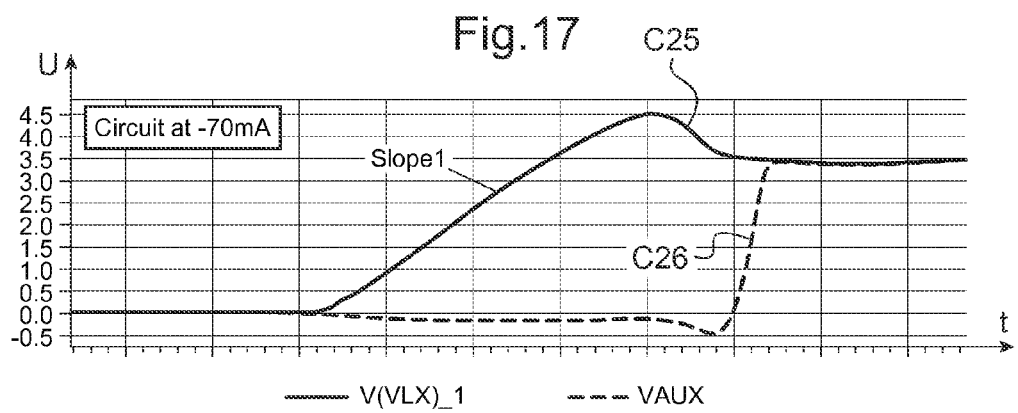
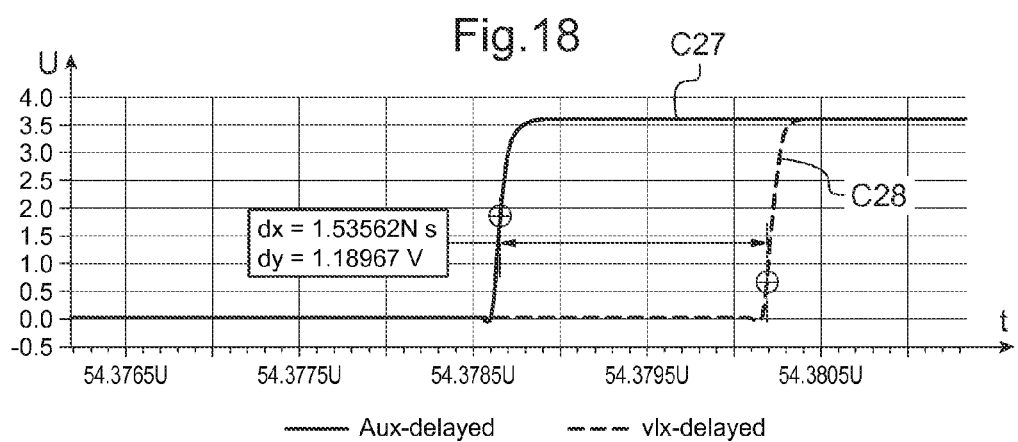

METHOD OF VALLEY INDUCTANCE CURRENT POLARITY DETECTION IN A PULSE WIDTH MODULATED CIRCUIT WITH AN INDUCTIVE CHARGE

PRIORITY CLAIM

This application claims priority from European Application for Patent No. 13305875.0 filed Jun. 25, 2013, the disclosure of which is incorporated by reference.

TECHNICAL FIELD

The invention relates to methods for detecting valley inductance current polarity change in a pulse width modulated circuit charged with an inductive charge, and also to associated detector circuits for detecting valley inductance current polarity change in a pulse width modulated circuit charged with an inductive charge.

BACKGROUND

In some electronic devices, as for example in switched-mode DC/DC converters, there is a valley inductance current which can become negative. This negative valley inductance current results in an inefficient power consumption. Therefore, to maintain the efficiency of the stand-by mode of the electronic device, which should be a low power consuming mode, this waste of energy, caused by the valley inductance current becoming negative, should be avoided. To achieve that, the valley inductance current polarity change should be detected as soon as possible, especially when this polarity goes from positive to negative. Therefore, some detectors of valley inductance current polarity change in a switched mode power supply (SMPS) circuit charged with an inductive charge have been developed.

It is known in the art, as described in more detail with respect to FIG. 1, to provide such a detector of valley inductance current polarity change in a pulse width modulated circuit charged with an inductive charge. The implementation of FIG. 1 presents a first drawback of being based on a very accurate comparator which is complex and expensive. A second drawback concerns performance degradation in some working modes and a need for some non-negligible static power consumption. This second drawback can be addressed, but at the cost of complicated design and calibration techniques, which in turn make the detector still more complex and expensive.

Therefore, prior art detectors either cannot provide an accurate detection of valley inductance current polarity change, or can provide for an acceptable detection of valley inductance current polarity change in terms of accuracy, but at the cost of a complex and expensive detection device.

SUMMARY

There is a need in the art to alleviate at least partly the above mentioned drawbacks.

More particularly, embodiments herein provide an accurate detection of valley inductance current polarity change which could be done in a simpler and preferably cheaper way than the known prior art. Therefore, embodiments herein compare the reaching time of a predetermined voltage by the circuit to what would have been this reaching of this predetermined voltage by the circuit if its valley inductance current was zero. Embodiments herein have indeed noticed that a negative valley inductance current makes the circuit reaching the predetermined voltage always before a positive valley inductance current.

To emulate the zero valley inductance current, an auxiliary circuit is preferably realized, the auxiliary circuit having preferably no inductive charge, and advantageously no charge at all. If the inductively charged circuit output (power-stage of the SMPS) reaches the predetermined voltage before the output of auxiliary circuit, then it can be deduced that the valley inductance current of the inductively charged circuit was negative. If, on the contrary, the inductively charged circuit reaches the predetermined voltage after the auxiliary circuit output, then it can be deduced that the valley inductance current of the inductively charged circuit was positive.

In the future, an accurate circuit of zero valley inductor current detection will become a key part of a certain number of electronic devices, among which include switched-mode DC/DC converters. In the following text, description will be concentrated on DC/DC converter, but this should not be construed as limiting the application of proposed detection method to DC/DC converters only. This will indeed allow for maintaining high efficiency for low power, as for instance stand-by, operation of the converter, thanks to the low frequency pulse skipping (PSK) operations of this converter.

The detection method and circuit proposed by embodiments herein is dedicated to accurate detection of the negative valley inductance current of a switched-mode step-down DC/DC converter. Compared to existing analog circuits of the prior art, the circuit can work with very low drain source resistance power stage of the converter and has practically zero static current consumption. This detection circuit exploits the specific time behavior of the power stage output voltage of the converter.

Thanks to a quite simple realization, this circuit preferably allows for simplifying the automatic mode selection functionality of the DC/DC converter to nothing more than a few digital gates. This, in turn, allows for increasing the power efficiency saving of the power management platform and also considerably reducing the needed silicon surface in the detection circuit.

The time domain zero valley current detector proposed by embodiments herein provides for detection of the boundaries between continuous conduction mode and discontinuous conduction mode with practically zero power consumption. This also helps considerably to improve the performance of the switched mode power supplies, mainly by reducing the static current consumption, and also by increasing the accuracy of the boundary detection between pulse skipping mode and pulse width modulation mode. Quite small integrated switched mode power supply converters using only rather simple circuit implementation can be built in that way. The detection circuit proposed by embodiments herein is however rather sensitive to the time offset which should be therefore preferably carefully controlled.

The proposed time domain detector aims to provide simple alternative to its voltage mode counterparts of the known prior art. Among other advantages, this detection according to embodiments herein presents practically zero static current consumption, practically complete insensitivity to L which is the value of the inductive charge as well as to $F_{SW}$ variation, which is the variation of the switching frequency of the pulse width modulation. Moreover accuracy of detection can be in order of 10 mA.

Embodiments herein propose a detection method and an associated detector.

In accordance with an embodiment, a method of detection of valley inductance current polarity change in a pulse width modulated circuit charged with an inductive charge is presented, wherein the detection method compares respective times of reaching a predetermined voltage between outputs respectively of said pulse width modulated circuit charged with an inductive charge and of a pulse width modulated reference circuit with no inductive charge.

In accordance with an embodiment, a detector of valley inductance current polarity change in a pulse width modulated circuit charged with an inductive charge is presented, wherein the detector comprises a comparator adapted to compare respective times of reaching a predetermined voltage between outputs respectively of said pulse width modulated circuit charged with an inductive charge and of a pulse width modulated reference circuit with no inductive charge.

Pulse width modulation is the same both for the pulse width modulated circuit charged with an inductive charge and for the pulse width modulated reference circuit with no inductive charge. Therefore, preferably, control PWM signals are the same both for the pulse width modulated circuit charged with an inductive charge and for the pulse width modulated reference circuit with no inductive charge.

Preferred embodiments comprise one or more of the following features, which can be taken separately or together, either in partial combination or in full combination:

said outputs respectively of said charged circuit and of said reference circuit are respectively connected to both inputs of an unstable RS flip-flop, said valley inductance current polarity change being detected from an output signal of said unstable RS flip-flop;

said unstable RS flip-flop is in undefined state before detection is performed;

said outputs are respectively connected through two delay lines, the delay line of said charged circuit being longer than the delay line of said reference circuit, preferably by at least 10 ps and at most 200 ps, more preferably by at least 10 ps and at most 100 ps;

said detection method assesses a negative valley inductance current when said charged circuit reaches said predetermined voltage before said reference circuit, said charged circuit being then preferably switched to pulse skipping mode;

said detection method assesses a positive valley inductance current when said reference circuit reaches said predetermined voltage before said charged circuit, said charged circuit being then kept in or switched back to pulse width modulation mode;

said charged circuit is the power stage of a switched-mode DC/DC converter, preferably of a switched-mode DC/DC converter switching between a pulse width modulation mode and a pulse skipping mode;

said charged circuit is a power stage comprising at least two transistors with a non-overlapping conduction period during voltage level transition in pulse width modulation;

said predetermined voltage is chosen so as to be reachable only outside said non-overlapping conduction period;

it is the valley inductance current polarity change during said non-overlapping conduction period which is detected, and which is preferably detected outside said non-overlapping conduction period;

said reference circuit is an auxiliary circuit which generates a reference auxiliary signal with the same time characteristics as the output signal that would be generated by a zero valley inductance current of said charged circuit;

said reference circuit comprises at least two transistors which are respectively down-sized, with respect to said transistors of said power stage, by an identical ratio α;

a computer program product comprising a computer readable medium, having thereon a computer program comprising program instructions, the computer program being loadable into a data-processing unit and adapted to cause execution of the method according to any of preceding claims when the computer program is run by the data-processing unit;

a switched-mode DC/DC converter including a detector according to embodiments.

Preferably, said charged circuit belongs to an electronic device adapted to switch between a high current switched-mode power supply and a low current switched-mode power supply.

Preferably, said detection method detects a negative valley inductance current in a switched-mode step-down DC/DC converter.

Preferably, said predetermined voltage ranges from 20% to 60% of the maximal reachable voltage, more preferably from 20% to 40% of said maximal reachable voltage, during pulse width modulation. Said predetermined voltage is preferably around 1 volt.

Preferably, said charged circuit comprises several power stages and said reference circuit comprises several stages which transistors are all respectively down-sized by said same identical ratio α, with respect to said transistors of said charged circuit. This means that canals of transistors of charged circuit are α times bigger than canals of transistors of reference circuit.

Preferably, said ratio α ranges from 100 to 10000.

Preferably, the output of power stage is located between said two transistors.

Preferably, the result of said detection method is used for automatic mode selection in the switched-mode DC/DC converter.

Preferably, said valley inductance current polarity change detection is performed with an accuracy of better than 50 mA, more preferably of better than 20 mA, even more preferably of better than 10 mA.

Preferably, said output of said charged circuit is connected to an input of said unstable RS flip-flop, upstream of said inductive charge. An unstable RS flip-flop is a flip-flop circuit with a set and a reset inputs.

Preferably, at least one of said delay lines comprises several serially connected inverters.

Preferably, the two transistors of the power stage are a PMOS transistor and a NMOS transistor.

Preferably, said predetermined voltage ranges from 0.8 volt to 1.2 volt.

BRIEF DESCRIPTION OF THE DRAWINGS

Further features and advantages of the invention will appear from the following description of embodiments, given as non-limiting examples, with reference to the accompanying drawings wherein:

FIG. 1 shows an example of a circuit allowing for detection of valley inductance current polarity change, according to the prior art;

FIG. 2 shows an example of a power stage of a DC/DC converter;

FIG. 3 shows an example of inductor current in a pulse width modulated circuit;

FIG. 13 shows another example of voltage transition simulation during non-overlapping phase of the transistors of a power stage of a DC/DC converter, without introduction of a delay between power stage and auxiliary stage of detector adapted to perform the method of detection of valley inductance current polarity change, according to embodiments, for a negative valley inductance current of about −14 mA;

FIG. 14 shows an example of modification of the voltage transition simulation of FIG. 13, because of introduction of a delay between power stage and auxiliary stage of detector adapted to perform the method of detection of valley inductance current polarity change, according to embodiments;

FIG. 15 shows another example of voltage transition simulation during non-overlapping phase of the transistors of a power stage of a DC/DC converter, without introduction of a delay between power stage and auxiliary stage of detector adapted to perform the method of detection of valley inductance current polarity change, according to embodiments, for a valley inductance current of about 0 mA;

FIG. 16 shows an example of modification of the voltage transition simulation of FIG. 15, because of introduction of a delay between power stage and auxiliary stage of detector adapted to perform the method of detection of valley inductance current polarity change, according to embodiments;

FIG. 17 shows another example of voltage transition simulation during non-overlapping phase of the transistors of a power stage of a DC/DC converter, without introduction of a delay between power stage and auxiliary stage of detector adapted to perform the method of detection of valley inductance current polarity change, according to embodiments, for a negative valley inductance current of about −70 mA; and FIG. 18 shows an example of modification of the voltage transition simulation of FIG. 17, because of introduction of a delay between power stage and auxiliary stage of detector adapted to perform the method of detection of valley inductance current polarity change, according to embodiments.

DETAILED DESCRIPTION

Figure 4:
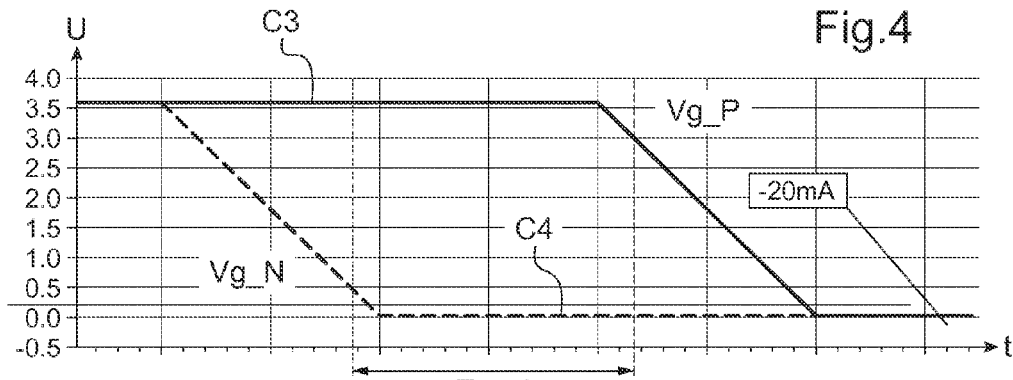
FIG. 4 shows an example of voltage command of the gate of the transistors of a power stage of a DC/DC converter.

FIG. 1 shows an example of a circuit allowing for detection of valley inductance current polarity change, according to the prior art. This circuit corresponds to an existing solution using a comparator, which is usually trimmed, and which is often associated to a sample and hold circuit. In the detector implementation of the prior art, the detection of zero valley inductance current is provided by the differential pair based comparator.

This detection circuit comprises a positive battery voltage 1, a ground 2, a power stage comprising two transistors 4 and 5 serially connected to each other between positive battery voltage 1 and ground 2, a sample and hold device 6, and a comparator 7. The power stage comprises a PMOS transistor 4 which gate is connected to a command signal 23 and a NMOS transistor 5 which gate is connected to a command signal 24. The output 3 of the power stage is between the two transistors 4 and 5. The sample and hold device 6 comprises a switch and a capacitor. The switch is connected between the output 3 and the positive input of the comparator 7. The capacitor is located between the switch and the ground 2. The negative input of the comparator 7 is connected to the ground 2. The comparator 7 has an output 8. In this first prior art, the comparator 7 is trimmed, and presents a high accuracy, a high power consumption and a high speed.

This configuration of the detection circuit of the prior art relies on the sensing of $V_{DS}$ voltage across the NMOS power transistor 5. The voltage across NMOS channel is given by ON resistance $R_{DS}$ and valley inductor current $I_L$:

$$V_{DS(VALLEY)} = I_{L(VALLEY)} \cdot R_{DS\_N}$$

This detection circuit based on the $V_{DS}$ voltage sensing suffers from the several following drawbacks. First, it presents a very low accuracy mainly due to the low $R_{DS}$ of power transistor 5. Second, the static power consumption is non-negligible, because of the bias current of the comparator 7. These drawbacks can be overcome at least partially, but then they need using trimming or some other complicated design techniques, or need some complicated calibration scheme. In another alternative of first prior art, a solution based on the body-diode detection is proposed but it presents however similar drawbacks.

FIG. 2 shows an example of a power stage of a DC/DC converter. The represented power stage is a PMOS-NMOS power stage of the step-down DC/DC converter. The power stage comprises a positive voltage 1 which will usually be a positive battery voltage, a negative or low voltage which will usually be the ground 2, two transistors 4 and 5 serially connected to each other between positive voltage 1 and ground 2. The power stage comprises a PMOS transistor 4 whose gate is connected to a command signal 23 and a NMOS transistor 5 whose gate is connected to a command signal 24. At the output 3 of the power stage located between the two transistors 4 and 5, there is an inductive charge 9.

FIG. 3 shows an example of inductor current in a pulse width modulated circuit. The current I at the output of the power stage is represented as a function of time t. The curve C1, in solid line, represents the current in usual working mode, in pulse width modulation mode. The curve C2, in dotted line, represents the operations where valley inductor current is negative, so where the circuit is preferably being operated in pulse-skipping (low power) mode. The current presents a triangular form. The valley inductance current is the lowest point of the triangular form. As soon as this lowest point crosses the zero value, then the switching between normal PWM pulse width modulation mode and low power pulse skipping mode is preferred. Therefore, as soon as a negative valley inductance current is detected, the mode switches from pulse width modulation to pulse skipping, and there is no more energy waste which would happen with the negative valley inductance current circulating in pulse width modulation mode. In pulse skipping mode, the power stage is OFF (or in high impedance) when the inductance current is negative.

In a mobile phone platform using a switched-mode DC/DC converter, two types of switched mode power supply may be required. First, a high current switched mode power supply, where the zero valley $I_L$ current detection is very difficult to achieve, because of the very low $R_{DS}$ resistance which is no more than a few mΩ. Second, a very low power switched mode power supply, where the detection degrades the performance, because of high static bias current consumption. Therefore, the new detection method proposed by embodiments herein will be very useful, since it does not suffer from the prior art limitations, because it is based on the time properties of the voltage at the output 3 of the power stage, also called $V_{LX}$ voltage.

FIG. 4 shows an example of voltage command of the gate of the transistors of a power stage of a DC/DC converter. The voltage is expressed in volts. The time is expressed in µs (microseconds). The curve C3 represents the voltage command 23 of the gate of the PMOS transistor 4 as a function of time t. The curve C4 represents the voltage command 24 of the gate of the NMOS transistor 5 as a function of time t. The PMOS transistor 4 is OFF at the high level of curve C3, whereas the PMOS transistor 4 is ON at the low level of curve C3. The NMOS transistor 5 is ON at the high level of curve C4, whereas the NMOS transistor 5 is OFF at the low level of curve C4. So, there is a period called Tnovl (non-overlapping time), which is a non-overlapping period during which both transistors 4 and 5 are OFF, and the body diode conduction can occur. So, the valley inductance current polarity (positive or negative) in this non-overlapping period Tnovl, will be detected. The non-overlapping period Tnovl may range from 2 to 10 ns.

Figure 5:
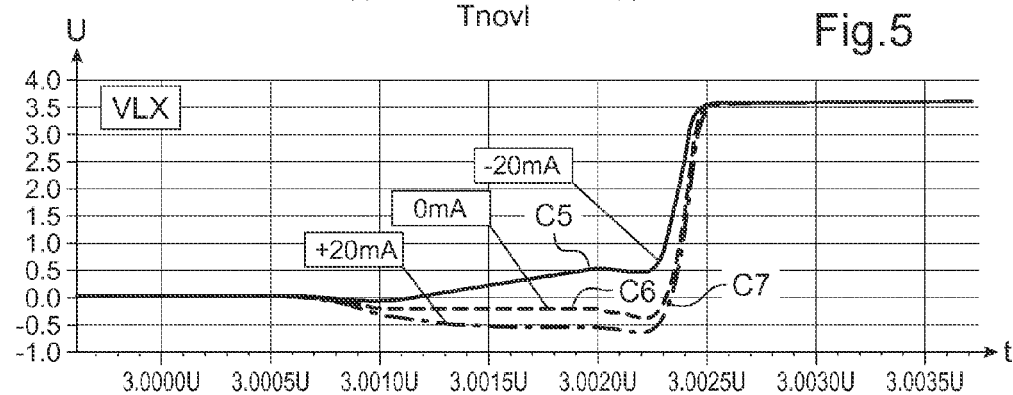
FIG. 5 shows an example of voltage transition simulation during non-overlapping period of the transistors of a power stage of a DC/DC converter.

FIG. 5 shows an example of voltage transition simulation during non-overlapping period of the transistors of a power stage of a DC/DC converter. Voltage expressed in volts is represented as a function of time expressed in µs. The voltage $V_{LX}$ is the voltage at the output 3 of the power stage. The curve C5 corresponds to a negative valley inductance current of about −20 mA. The curve C6 corresponds to a zero valley inductance current of about 0 mA. The curve C7 corresponds to a positive valley inductance current of about 20 mA. Different behaviors of $V_{LX}$ voltage transition, depending on the polarity of the valley inductance current, may be observed. For a zero $I_L$ valley current value, there is practically no slope and the voltage is flat. For a slightly positive $I_L$ valley current value, the voltage decreases with a roughly constant and slight slope down to the substrate-diode forward voltage (around 0.7V). For a slightly negative $I_L$ valley current value, the voltage increases with a roughly constant and more pronounced slope.

Figure 6:
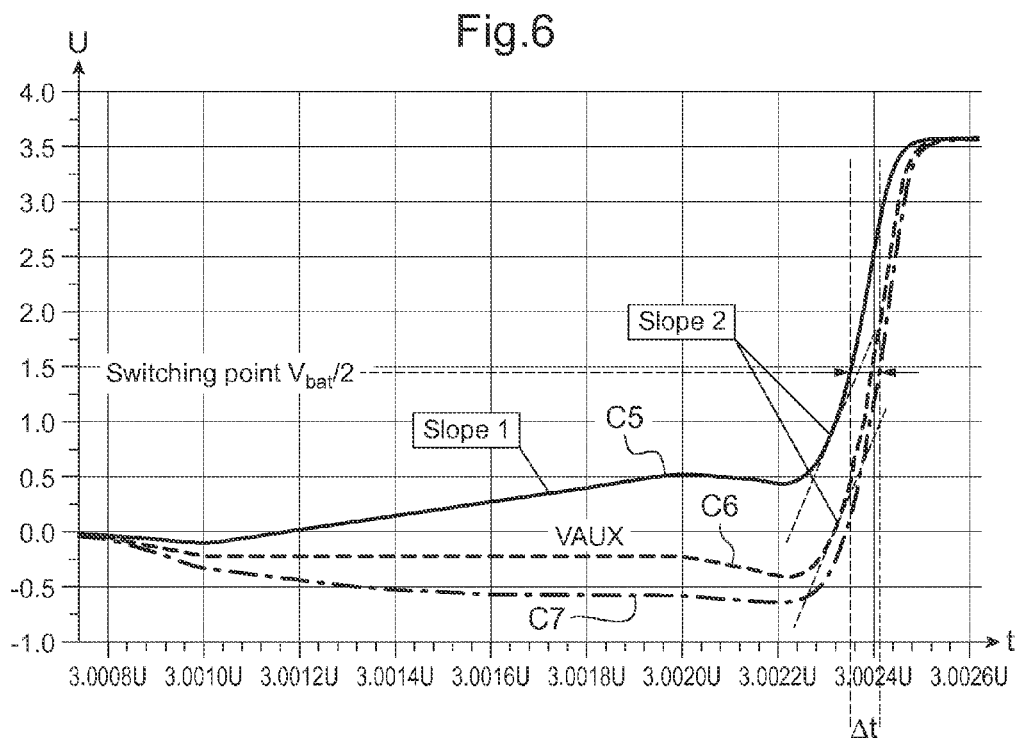
FIG. 6 shows a zoom of FIG. 5.

FIG. 6 shows a zoom of FIG. 5. During the non-overlapping period, the curve C5 raises with a roughly constant slope 1, the curve C6 stays flat and the curve C7 lowers with a roughly constant slope (which is different from slope 1) towards substrate diode voltage which is around 0.7V. At the end of this non-overlapping period, all three curves C5, C6 and C7 raise with a roughly constant slope 2 which is roughly the same for all three curves C5, C6 and C7. Because of their specific slopes during the non-overlapping period and their same raising slope at the end of this non-overlapping period, the curves C5, C6 and C7 will present the property of reaching any predetermined voltage threshold like for example half the positive voltage 1, in always the same order. This order is that the curve corresponding to a negative valley inductance current will reach the predetermined voltage first, and the more negative it will reach this predetermined voltage. The curve corresponding to a positive valley inductance current will reach the predetermined voltage last, and the more positive the slowest it will reach this predetermined voltage, the curve corresponding to a zero valley inductance current will reach the predetermined voltage after all curves corresponding to negative valley inductance currents, but before all curves corresponding to positive valley inductance currents, even if the time difference between zero-valley current and positive valley current is quite small). When comparing the reaching time of the predetermined voltage, for two curves, one being known to correspond to zero valley inductance current and being used as a reference, if the other curve reaches the predetermined voltage before the reference curve, it means that it corresponds to a negative valley inductance current, whereas if the other curve reaches the predetermined voltage after the reference curve, it means that it corresponds to a positive valley inductance current.

Figure 7:
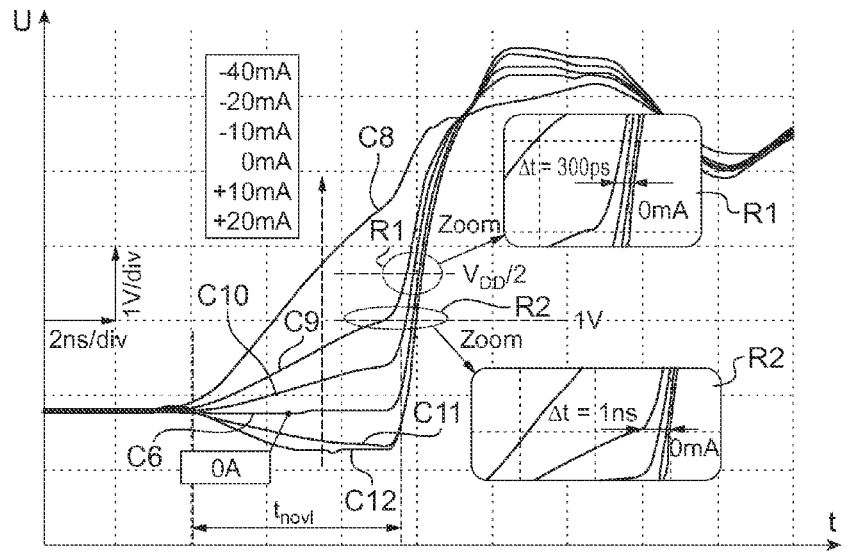
FIG. 7 shows an example of voltage transition measurements during non-overlapping phase of the transistors of a power stage of a DC/DC converter.

FIG. 7 shows an example of voltage transition measurements during non-overlapping phase of the transistors of a power stage of integrated DC/DC converter. The measurements of FIG. 7 largely confirm the simulations of FIGS. 5 and 6. Voltage expressed in volts is represented as a function of time expressed in ns. The scale of the FIG. 7 is given on the FIG. 7 itself. The represented voltage is the voltage at the output 3 of the power stage. The curve C8 corresponds to a negative valley inductance current of about −40 mA. The curve C9 corresponds to a negative valley inductance current of about −20 mA. The curve C10 corresponds to a negative valley inductance current of about −10 mA. It can be seen that, the more important the negative valley inductance current, the steepest is the raising slope of the voltage during the non-overlapping period Tnovl. The curve C6 again corresponds to a zero valley inductance current of about 0 mA. The curve C11 corresponds to a positive valley inductance current of about 10 mA. The curve C12 corresponds to a positive valley inductance current of about 20 mA. FIG. 7 corresponds to a power stage dimensioned for 1000 mA.

Two different predetermined voltages are considered, half of the positive voltage 1 being reached by the different curves in the region R1, and 1 volt being reached by the different curves in the region R2. It can be seen, that whatever the chosen predetermined voltage, it is reached in the same order which is from first to last: curves corresponding to negative valley inductance current, curve C8, curve C9, curve C10, then curve corresponding to zero valley inductance current, curve C6, and then curves corresponding to positive valley inductance current, curve C11, curve C12. It can be seen that, if the predetermined voltage is chosen too high, then the difference in reaching times becomes quite small, what can be seen in region R1, whereas if the predetermined voltage is chosen too small, then the difference in reaching times is important but the voltage level may be measured less accurately because of the noise level; the best and preferred region is region 2, where the predetermined voltage is chosen about 1 volt, preferably between 0.8 volt and 1.2 volt, the difference in reaching times is still important and the noise level is still relatively small: it seems to be the best compromise. However, other predetermined voltages may be used too and they work too.

Figure 8:
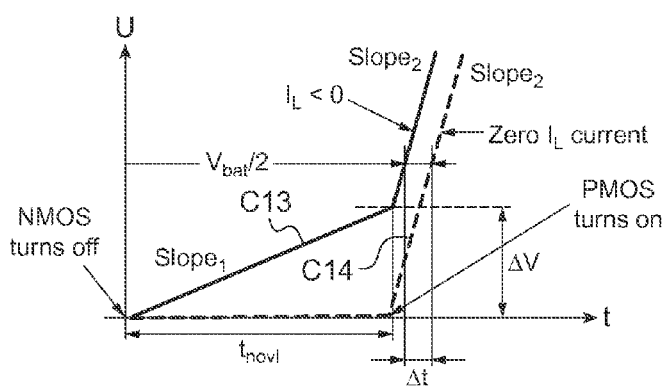
FIG. 8 shows an example of voltage transition approximation during non-overlapping phase of the transistors of a power stage of a DC/DC converter, explaining the comparison between reaching times performed by the method of detection of valley inductance current polarity change, according to embodiments.

FIG. 8 shows an example of voltage transition approximation during non-overlapping phase of the transistors of a power stage of a DC/DC converter, explaining the comparison between reaching times performed by the method of detection of valley inductance current polarity change, according to embodiments. The approximation makes the curves simpler and allows for simple and detailed analysis of this voltage transition zone which corresponds to the non-overlapping period where both transistors 4 and 5 are OFF. Voltage is represented as a function of time. Predetermined voltage is half the positive voltage 1. The non-overlapping period Tnovl ranges from the turning off of NMOS transistor 5 to the turning on of PMOS transistor 4. One curve C13 corresponds to a negative valley inductance current and one curve C14 corresponds to a zero valley inductance current.

Curve C13 reaches predetermined voltage before curve C14. The difference between reaching times will now be analyzed in more detail. At the end of conduction of NMOS transistor 5, that is when valley inductance current flows through the inductor, $V_{LX}$ voltage at output 3 may have different behaviors depending on the valley current polarity. In the first case corresponding to negative valley inductance current, when the current enters into the output 3, the current being supplied by the inductive charge and both transistors 4 and 5 being off, the voltage at the output 3 starts to increase with positive a slope 1, as shown previously. In the second case corresponding to zero valley inductance current, where there is no current being supplied by the inductive charge, the voltage of the output 3 remains unchanged. In the third case corresponding to positive valley inductance current, the body-diode junction capacitance of transistor starts to be charged.

The slope 1 value can be determined by the valley inductance current $I_L$, and parasitic capacitance $C_{LX}$ of the $V_{LX}$ node which is at output 3. This parasitic capacitance $C_{LX}$ is mainly given by the overlap and drain junction capacitance:

$$C_{LX}=C_{ox}\times(W_P+W_N)L_D+C_{j(N,P)}\times(W_P+W_N) \quad (1.1)$$

with $C_{ox}$ the capacitance per area unit, here per µm², $W_P$ the width of the PMOS canal, $W_N$ the width of the NMOS canal, $L_D$ the diffusion drain overlap length, $C_{j(N,P)}$ the junction capacitance. $C_{LX}$ value is approximately 30 pF for a 500 mA power stage. Slope 1 value can then be expressed as:

$$\text{slope } 1 = \Delta V_{LX}/\Delta t = I_L/C_{LX} \quad (1.2)$$

It can be considered that, in following switching phase, when PMOS transistor 4 turns ON, $V_{LX}$ voltage starts immediately to raise with a high slope 2. It can be seen on FIG. 8 that slope 2 is much steeper than slope 1. Moreover, due to the high value of slope 2, its value may be difficult to determine with precision. But, what is interesting is that, as previously mentioned, slope 2 value is independent on the value of the valley inductance current $I_L$ which can be considered constant for given operation conditions. Due to the positive voltage shift ΔV, which can be seen on FIG. 8, created during the non-overlapping period Tnovl, the $V_{LX}$ voltage with negative valley inductance current $I_L$ has a small time advance Δt compared to its zero current counterpart. This can also be seen on FIG. 8.

The ΔV can be expressed as:

$$\Delta V=\text{Tnovl}\times(I_L/C_{LX}) \quad (1.3)$$

and Δt is therefore function of the slope 2:

$$\Delta t = \Delta V/\text{slope } 2 = [\text{Tnovl}\times(I_L/C_{LX})]/\text{slope } 2 \quad (1.4)$$

The time advance Δt is in order of hundredth of picoseconds up to units of nanoseconds, depending on the valley-current value. Such short time shift can be detected by using the detection circuit shown on FIG. 9 which will be detailed later on.

The slope 2 value results mainly from parasitic capacity in $V_{LX}$ node at output 3, and from charging current $I_{D(P)}$ delivered by the power PMOS transistor 4. This parasitic capacitance is mainly determined by the sum of the drain parasitic capacitances of both transistors, because the routing capacitances are negligible. The charging current rate is determined by the size of the PMOS transistor 4 and the gate voltage rise time. While the value of slope 2 is difficult to determine with precision, it is interesting to notice that the value of slope 2 is independent on the absolute value of PMOS transistor channel width $W_P$ resulting in possible constant PMOS to NMOS transistor channel width ratio, that is for a given $W_P/W_N$ ratio, between power-stage and auxiliary reference circuit.

During opening of the PMOS transistor, device passes through both—saturation and ohmic region. In both regimes, drain current ID(P) depends linearly on the channel width W. As both overlap and sidewall drain junction capacitances depends also linearly on W, charging rate I(P)/Cd can be approximated as:

$$I_{D(P)}/C_{(d)} \text{ is nearly equal to } [K_P(W/L_D)f(V_{GS}\ldots)]/[C_{ox}(WL_D)+C_jW] \quad (1.5)$$

which is independent on W, with $W=W_P+W_N$, $K_P$ the transistor gain parameter, $L_D$ the diffusion drain overlap length also called channel overlap length, $f(V_{GS}\ldots)$ a term depending on the transistor operation region, $C_{(d)}$ the transistor parasitic drain capacitance, C, the drain junction capacitance.

Figure 9:
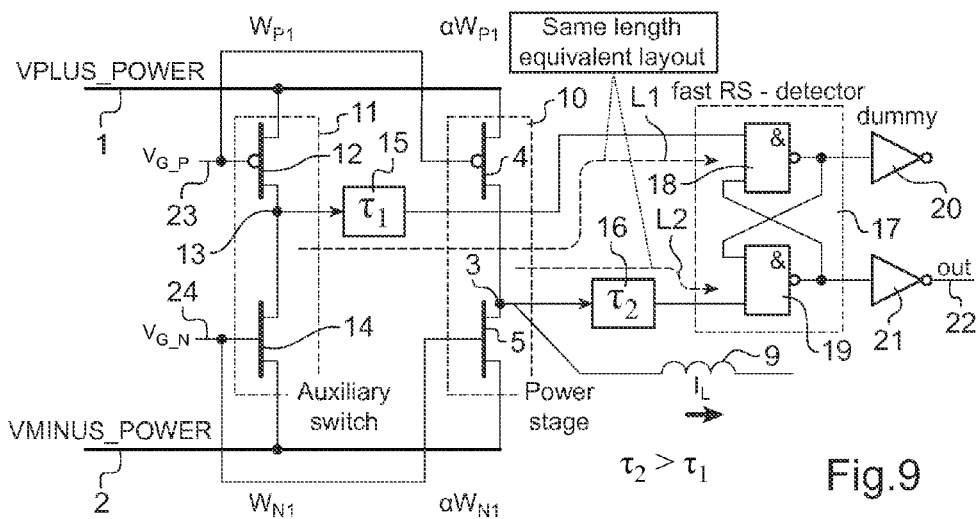
FIG. 9 shows an example of detector adapted to perform the method of detection of valley inductance current polarity change, according to embodiments.

FIG. 9 shows an example of detector adapted to perform the method of detection of valley inductance current polarity change, according to embodiments. The represented power stage is a PMOS-NMOS power stage of the step-down DC/DC converter. The power stage 10 comprises positive voltage 1 which will usually be a positive battery voltage, a negative or low voltage which will usually be the ground 2, two transistors 4 and 5 serially connected to each other between positive voltage 1 and ground 2. The power stage comprises a PMOS transistor 4 whose gate is connected to a command signal 23 and a NMOS transistor 5 whose gate is connected to a command signal 24. At the output 3 of the power stage located between the two transistors 4 and 5, there is an inductive charge 9 which is the inductor of the output LC filter. Connected to the output 3, there is a delay line 16. Output of delay line 16 is connected to a detection input of an unstable RS flip-flop 17. Between output 3 and this detection input of the unstable RS flip-flop 17, there is an electrical line of length L2.

Disposed in parallel to the power stage 10, there is an auxiliary reference circuit 11. This auxiliary reference circuit 11 comprises two transistors 12 and 14 serially connected to each other between positive voltage 1 and ground 2. The auxiliary reference circuit 11 comprises a PMOS transistor 12 whose gate is connected to the same command signal 23 as transistor 4 and a NMOS transistor 14 whose gate is connected to the command signal 24 as transistor 5. At the output 13 of the auxiliary reference circuit 11 located between the two transistors 12 and 14, there is no inductive charge, and indeed no charge at all. Connected to the output 13, there is a first delay line 15. First delay line 15 is connected to another input, a reference input, of an unstable RS flip-flop 17 than the detection input connected to second delay line 16. Between output 13 and this reference input of the unstable RS flip-flop 17, there is an electrical line of length L1 which is the same as length L2, apart from the values $\tau_1$ and $\tau_2$ of the delay lines 15 and 16. So, the only difference for signal variations propagating through the lines L1 and L2 will be the relative values of $\tau_1$ and $\tau_2$ of the delay lines 15 and 16, as well as of course the propagation starts from outputs 13 and 3 of these signal variations. The represented detection circuit respects the conditions so that the slope 2 is independent on the absolute value of $W_P$, because there is a constant PMOS to NMOS transistor channel width ratio ($W_P/W_N$) ratio, since the channel width ratio $\alpha$ between PMOS transistors 4 and 12 is the same as between NMOS transistors 5 and 14. Preferably $\alpha$ value is about 1000.

The unstable RS flip-flop 17 acts as a fast detector of the relative reaching times of the predetermined voltage between output signals respectively at output 3, for the inductively charged circuit, that is for the power stage 10, and at output 13, for the auxiliary reference circuit 11. The unstable RS flip-flop 17 comprises two NAND gates 18 and 19. Detection input of unstable RS flip-flop 17 is one input of the NAND gate 19, whereas its other input is connected to the output of NAND gate 18. Reference input of unstable RS flip-flop 17 is one input of the NAND gate 18, whereas its other input is connected to the output of NAND gate 19. Output of NAND gate 18 is also connected to the input of an inverter 20 which output is dummy, that is not connected to anything; therefore is created the identical load capacity as the capacitance presented in gate 19, in order to have symmetric structures. Output of NAND gate 19 is also connected to the input of an inverter 21 which output 22 will give the winner in the race to reach the predetermined voltage; from output 22 value, it is possible to deduce whether the reaching of the predetermined voltage happened first at output 3 or at output 13, hence it can be deduced whether the valley inductance current is negative or positive. This will now be explained in more detail.

The detection circuit represented on FIG. 9 uses an auxiliary reference circuit 11, which is switching in the exactly same rate as the power stage, which means it shares the same gate driving signals. Moreover, it shares also the positive and negative voltage supply lines of power-stage and auxiliary circuit which are to be connected with very low resistance connections. However, as the auxiliary reference circuit 11 has zero load current at its output 13, its output voltage corresponds to the output voltage of the power stage 10 with zero output current, see curve C6 in FIG. 6. The detector will thus detect the order of transition of power stage 10 and auxiliary reference circuit 11 output voltages. Either power stage 10 output voltage transits before the auxiliary reference circuit 11 output voltage, which means negative valley current is detected, in which case the pulse skipping mode is allowed, or power stage 10 output voltage transits after the auxiliary reference circuit 11 output voltage, which means positive valley current is detected, in which case the circuit is operating in pulse width modulation mode.

The circuit represented on FIG. 9 therefore comprises an auxiliary reference circuit 11, which generates a reference zero current voltage signal, which is equivalent to output voltage signal of power stage 10 for a zero valley inductance current. It also comprises two delay lines 15 and 16, delay line 15 with a delay time $\tau_1$ and delay line 16 with a delay time $\tau_2$, and a fast detector made of an unstable RS flip-flop 17. Thanks to the fact, that the unstable RS flip-flop 17 is in the undefined state before detection, both inputs being at low voltage, this detection circuit is able to detect the respective transition times order with a few picoseconds resolution. The auxiliary reference circuit 11 is designed as scaled replica of the power-stage 10. This is to say, the channel W of the auxiliary NMOS and PMOS switches are down-sized by identical ratio $\alpha$, when going from power stage 10 to auxiliary reference circuit 11. Other parasitic capacitances, as the external parasitic capacitance, should be added in scaled replica to the output of the auxiliary reference circuit 11, in order to provide accurate reference signal generation.

As can be seen from previous FIG. 6 showing the voltage transition, the slope 2, being very fast, causes practically zero time shift between the cases of zero valley inductance current (see curve C6) and a somewhat positive valley inductance current like for example +20 mA (see curve C7). On this account, the delay lines 15 and 16 are very useful, since they allow for introducing an auxiliary delay $\tau_2 > \tau_1$ in order to compensate a possible time shift error going in wrong direction, that is to avoid that the auxiliary reference voltage transition occurs after the power stage voltage transition, when the power stage voltage transition corresponds to a positive valley inductance current. This delay difference $\Delta\tau(\tau_2-\tau_1)$ is realized by adding a few serially connected inverters, and preferably can be programmable. The current threshold shift caused by such a delay can be obtained from previous equation (1.4) which gives:

$$I_{det} = (C_{LX} \times \Delta\tau \times slope\ 2)/Tnovl \quad (1.6)$$

This current $I_{det}$ is in order of about $-10$ mA. Indeed, this introduced delay difference $\Delta\tau$ shifts slightly the current threshold, but it has the advantage of protecting the detection circuit against a possible dysfunction which would be caused by power stage voltage transition occurring before the transition of auxiliary reference circuit, when the valley inductance current is positive. Preferably, in order to increase the accuracy of the detection, asymmetrical inverters can be used to shift the switching point Vbat/2 (see FIG. 8) or $V_{DD}/2$ (see FIG. 7) to a lower value making that way detection more sensitive, for example to 1 volt (see FIG. 7).

Figure 10:
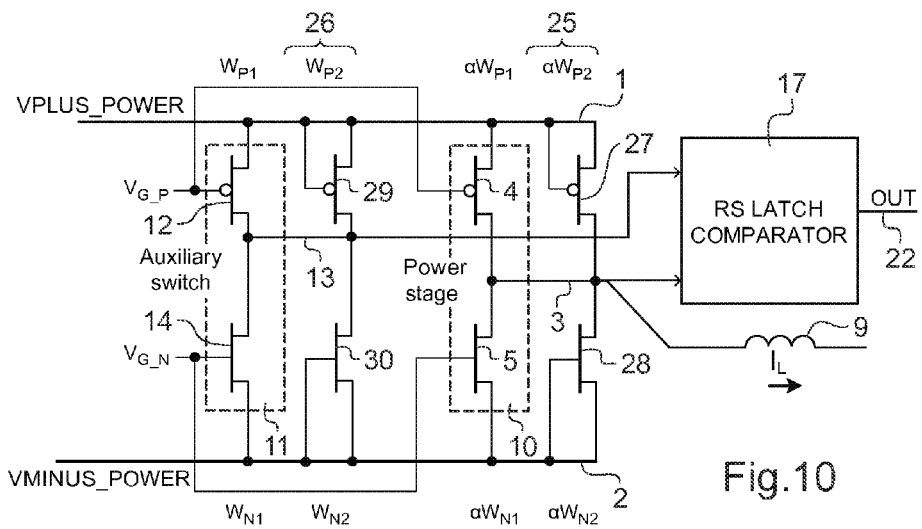
FIG. 10 shows another example of detector adapted to perform the method of detection of valley inductance current polarity change, according to embodiments.

FIG. 10 shows another example of detector adapted to perform the method of detection of valley inductance current polarity change, according to embodiments. The whole power stage not only comprises power stage 10 with transistors 4 and 5 but also an additional part 25 comprising transistors 27 and 28 which are disposed in parallel to transistor 4 and 5. The whole auxiliary reference circuit not only comprises auxiliary reference circuit 11 with transistors 12 and 14 but also an additional part 26 comprising transistors 29 and 30 which are disposed in parallel to transistor 12 and 14. In switched mode power supply design, a functionality of the power stage size variation is used to reduce the switching losses for low current operations. In this case, in order to emulate accurately the power stage parasitic capacitance (see equation 1.1), exact scaled structure, as compared to power stage, is preferably used in the detection circuit. When a part of the power stage is not active, for example part 25, the transistors 29 and 30 of part 26 are added to the transistors 12 and 14, in order to emulate the parasitic drain capacitance of the inactive part 25 of the power stage.

Figure 11:
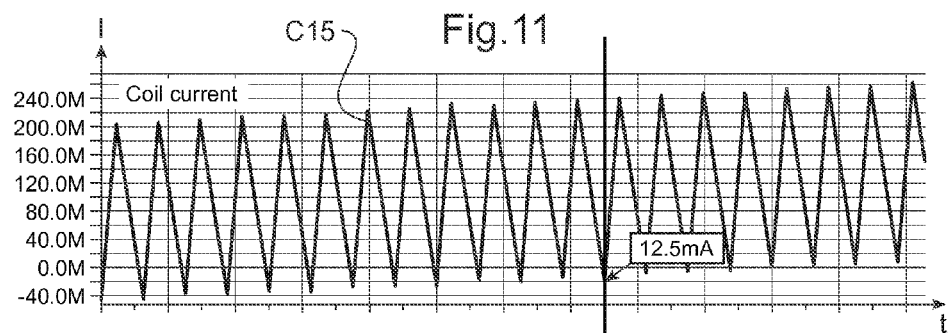
FIG. 11 shows an example of inductor current value in a pulse width modulated circuit.

FIG. 11 shows an example of current value in a pulse width modulated circuit. The curve C15 represents the inductor current as a function of time. Valley inductance current is negative first, then becomes close to zero, and becomes positive afterwards. The current is expressed in mA, whereas the time is expressed in µs, the time axis being synchronized with the time axis of FIG. 12.

Figure 12:
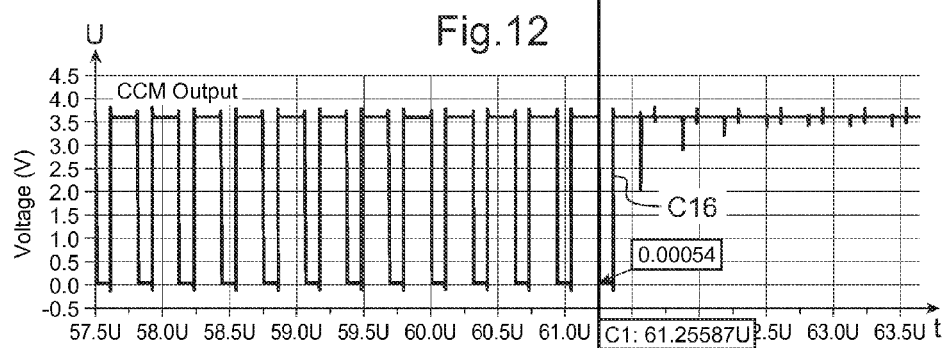
FIG. 12 shows an example of detector output corresponding to valley-current polarity of inductor current from FIG. 11.

FIG. 12 shows an example of detector output corresponding to current value of FIG. 11. The voltage is expressed in volts, whereas the time is expressed in µs, the time axis being synchronized with the time axis of FIG. 11. The curve C16 represents the detector output voltage as a function of time and is synchronized with curve C15 on FIG. 11. All the time that the valley inductance current remains negative on FIG. 11, the voltage on FIG. 12 presents a corresponding low level, witness of this negative valley inductance current. Once the valley inductance current becomes and stays positive on FIG. 11, the voltage on FIG. 12 only presents a corresponding high level.

FIG. 13 shows another example of voltage transition simulation during non-overlapping phase of the transistors of a power stage of a DC/DC converter, without introduction of a delay between power stage and auxiliary stage of detector adapted to perform the method of detection of valley inductance current polarity change, according to embodiments, for a negative valley inductance current of about −14 mA. The curve C17 represents the voltage at the output 3 of the power stage 10 as a function of time. The voltage is expressed in volts, whereas the time is expressed in µs. The voltage transition of curve C17 corresponds to a negative valley inductance current of about −14 mA. The curve C18 represents the voltage at the output 13 of the auxiliary reference circuit 11 as a function of time. The curve C17 reaches the predetermined voltage before the reference curve C18, with an advance time of about 165 ps.

FIG. 14 shows an example of modification of the voltage transition simulation of FIG. 13, because of introduction of a delay between power stage and auxiliary stage of detector adapted to perform the method of detection of valley inductance current polarity change, according to embodiments. The voltage is expressed in volts, whereas the time is expressed in µs. Because of the delay lines implemented, the curve C17 has been transformed into the curve C20 and the reference curve C18 has been transformed into the reference curve C19. The voltage transitions of the respective curves C19 and C20 arrive almost simultaneously. Therefore, the sensitivity, for this type of detection circuit including the delay lines, to detect a negative valley inductance current, is here of about 14 mA. The front ends of the voltage transitions are also made steeper with the addition of delay lines, what improves detection quality.

FIG. 15 shows another example of voltage transition simulation during non-overlapping phase of the transistors of a power stage of a DC/DC converter, without introduction of a delay between power stage and auxiliary stage of detector adapted to perform the method of detection of valley inductance current polarity change, according to embodiments, for a valley inductance current of about 0 mA. The curve C21 represents the voltage at the output 3 of the power stage 10 as a function of time. The voltage is expressed in volts, whereas the time is expressed in µs. The voltage transition of curve C21 corresponds to a zero valley inductance current of about 0 mA. The curve C22 represents the voltage at the output 13 of the auxiliary reference circuit 11 as a function of time. The curve C21 reaches the predetermined voltage before the reference curve C22, with an advance time of about 55 ps, whereas curves C21 and C22 should have theoretically reached the predetermined voltage almost simultaneously.

FIG. 16 shows an example of modification of the voltage transition simulation of FIG. 15, because of introduction of a delay between power stage and auxiliary stage of detector adapted to perform the method of detection of valley inductance current polarity change, according to embodiments. The voltage is expressed in volts, whereas the time is expressed in µs. Because of the delay lines implemented, the curve C21 has been transformed into the curve C24 and the reference curve C22 has been transformed into the reference curve C23. With the introduced delay times, now the curve C24 performs its voltage transition, and also reaches the predetermined voltage, about 106 ps later than the reference curve C23. The introduced delay time difference is then about 161 ps (55 ps+106 ps). This introduced delay time difference will ensure that no zero or positive valley inductance current will make curve C24 arrive before reference curve C23. The front ends of the voltage transitions are again made steeper with the addition of delay lines.

FIG. 17 shows another example of voltage transition simulation during non-overlapping phase of the transistors of a power stage of a DC/DC converter, without introduction of a delay between power stage and auxiliary stage of detector adapted to perform the method of detection of valley inductance current polarity change, according to embodiments, for a negative valley inductance current of about −70 mA. The curve C25 represents the voltage at the output 3 of the power stage 10 as a function of time. The voltage is expressed in volts, whereas the time is expressed in µs. The voltage transition of curve C25 corresponds to a highly negative valley inductance current of about −70 mA. The curve C26 represents the voltage at the output 13 of the auxiliary reference circuit 11 as a function of time. The curve C25 reaches the predetermined voltage well before the reference curve C26. It can even be seen that, because of the high value of negative valley inductance current, there is even a temporary over voltage in the curve C25 before it reaches its stable voltage.

FIG. 18 shows an example of modification of the voltage transition simulation of FIG. 17, because of introduction of a delay between power stage and auxiliary stage of detector adapted to perform the method of detection of valley inductance current polarity change, according to embodiments. The voltage is expressed in volts, whereas the time is expressed in µs. Because of the delay lines implemented, the curve C25 has been transformed into the curve C27 and the reference curve C26 has been transformed into the reference curve C28. With the introduced delay times, the curve C27 performs its voltage transition, and also reaches the predetermined voltage, well before the reference curve C28, about 1.5 ns before. The introduced delay time difference is that case superfluous for such a value of negative valley inductance current, but again it allows for ensuring that no zero or positive valley inductance current will make curve C27 arrive before reference curve C28.

The invention has been described with reference to preferred embodiments. However, many variations are possible within the scope of the invention.

What is claimed is:

1. A method of detecting valley inductance current polarity change in a pulse width modulated circuit charged with an inductive charge, comprising:
   comparing respective times of reaching a voltage level between a first output of said pulse width modulated circuit charged with an inductive charge and a second output of a pulse width modulated reference circuit with no inductive charge.

2. The detection method according to claim 1, wherein said first and second outputs are respectively connected to both inputs of an unstable RS flip-flop, and further comprising detecting said valley inductance current polarity change from an output signal of said unstable RS flip-flop.

3. The detection method according to claim 2, further comprising setting said unstable RS flip-flop is in undefined state before detection is performed.

4. The detection method according to claim 2, further comprising delaying signals from said first and second outputs through two delay lines, a first of the delay lines being longer than a second of the delay lines.

5. The detection method according to claim 4, wherein the second of the delay lines is longer by between 10 ps and 200 ps.

6. The detection method according to claim 4, wherein the second of the delay lines is longer by between 10 ps and 100 ps.

7. The detection method according to claim 1, further comprising detecting a negative valley inductance current when said circuit charged with an inductive charge reaches said voltage level before said circuit with no inductive charge.

8. The detection method according to claim 7, further comprising switching said circuit charged with an inductive charge to a pulse skipping mode of operation.

9. The detection method according to claim 1, further comprising detecting a positive valley inductance current when said circuit with no inductive charge reaches said voltage level before said circuit charged with an inductive charge.

10. The detection method of claim 9, further comprising either switching said circuit charged with an inductive charge to a pulse width modulation mode of operation or keeping said circuit charged with an inductive charge in the pulse width modulation mode of operation.

11. The detection method according to claim 1, wherein said circuit charged with an inductive charge is a power stage of a switched-mode DC/DC converter, and further comprising switching operation of the power stage between a pulse width modulation mode and a pulse skipping mode in response to the comparison.

12. The detection method according to claim 1, wherein said circuit charged with an inductive charge is a power stage comprising at least two transistors with a non-overlapping conduction period at voltage level change in pulse width modulation, wherein said voltage level is reachable only outside said non-overlapping conduction period; and further comprising detecting valley inductance current polarity change outside said non-overlapping conduction period.

13. The detection method according to claim 1, wherein said circuit with no inductive charge is an auxiliary circuit configured to generate a reference auxiliary signal having time characteristics similar to an output signal generated by a zero valley inductance current of said circuit charged with an inductive charge.

14. The detection method according to claim 1 as implemented by program instructions stored on a non-volatile computer readable medium and configured for execution by a data-processing unit.

15. A circuit, comprising:
a pulse width modulated circuit charged with an inductive charge and having a first output;
a pulse width modulated reference circuit with no inductive charge having a second output;
a detector circuit configured to detect valley inductance current polarity change in said pulse width modulated circuit charged with an inductive charge, wherein the detector circuit comprises a comparator configured to compare respective times that the first output and second output reach a voltage level.

16. The circuit of claim 15, wherein the pulse width modulated circuit charged with an inductive charge is a component of a switched-mode DC/DC converter operable in response to said detector circuit to switch between a pulse width modulation mode and a pulse skipping mode.

17. The circuit according to claim 15, wherein the detector circuit further comprises an unstable RS flip-flop having inputs coupled to said first and second outputs, said unstable RS flip-flop generating an output signal indicative of detection of said valley inductance current polarity change.

18. The circuit according to claim 17, wherein said unstable RS flip-flop is in undefined state before detection is performed.

19. The circuit according to claim 17, wherein the detector circuit comprises:
a first delay line coupling the first output to one input of the unstable RS flip-flop; and
a second delay line coupling the second output to another input of the unstable RS flip-flop;
wherein the first delay line is longer than the second delay line.

20. The circuit according to claim 19, wherein the second delay line is longer by between 10 ps and 200 ps.

21. The circuit according to claim 19, wherein the second delay line is longer by between 10 ps and 100 ps.

22. The circuit according to claim 15, wherein said detector circuit generates an output signal indicating detection of a negative valley inductance current when said first output reaches said voltage level before said second output.

23. The circuit according to claim 22, further comprising circuitry configured to switch said circuit charged with an inductive charge to a pulse skipping mode of operation in response to said output signal.

24. The circuit according to claim 15, wherein said detector circuit generates an output signal indicating detection of a positive valley inductance current when said second output reaches said voltage level before said first output.

25. The circuit of claim 24, further comprising circuitry configured to either switch said circuit charged with an inductive charge to a pulse width modulation mode of operation or keep said circuit charged with an inductive charge in the pulse width modulation mode of operation in response to said output signal.

26. The circuit according to claim 15, wherein said circuit charged with an inductive charge is a power stage comprising at least two transistors with a non-overlapping conduction period at voltage level change in pulse width modulation.

27. The circuit according to claim 26, wherein said voltage level is reachable only outside said non-overlapping conduction period, and wherein valley inductance current polarity change during said non-overlapping conduction period is detected outside said non-overlapping conduction period.

28. The circuit according to claim 26, wherein said circuit with no inductive charge comprises at least two transistors which are respectively down-sized with respect to said two transistors of said power stage by an identical ratio $\alpha$.

29. The circuit according to claim 15, wherein said circuit with no inductive charge is an auxiliary circuit configured to generate a reference auxiliary signal having time characteristics similar to an output signal generated by a zero valley inductance current of said circuit charged with an inductive charge.

* * * * *